United States Patent
Sutardja (10) Patent No.: US 8,860,201 B1
(45) Date of Patent: *Oct. 14, 2014

(54) STACKED INTEGRATED CIRCUIT PACKAGE USING A WINDOW SUBSTRATE

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 93 days.

This patent is subject to a terminal disclaimer.

(21) Appl. No.: 13/595,601

(22) Filed: Aug. 27, 2012

Related U.S. Application Data (63) Continuation of application No. 12/565,430, filed on Sep. 23, 2009, now Pat. No. 8,253,231.

(60) Provisional application No. 61/099,355, filed on Sep. 23, 2008, provisional application No. 61/121,018, filed on Dec. 9, 2008.

(51) Int. Cl.
*H01L 23/02* (2006.01)
*H01L 23/00* (2006.01)
*H01L 25/065* (2006.01)
*H01L 23/13* (2006.01)

(52) U.S. Cl.
CPC ............ *H01L 24/18* (2013.01); *H01L 25/0657* (2013.01); *H01L 23/13* (2013.01)
USPC ........................................................ 257/686

(58) Field of Classification Search
CPC ............ H01L 25/0657; H01L 25/0655; H01L 25/0652; H01L 23/13; H01L 24/16; H01L 24/48; H01L 2224/16225; H01L 2224/48091; H01L 2224/48137; H01L 2224/48145; H01L 2224/48227; H01L 2224/4824; H01L 2225/06506; H01L 2225/0651; H01L 2225/06527; H01L 2225/06572; H01L 2924/14; H01L 2924/15311; H01L 2924/3011; H01L 2924/00014; H01L 2924/1815; H01L 2924/19107
USPC .................. 257/686, 723, 690, 698, E25.013
See application file for complete search history.

(56) References Cited

U.S. PATENT DOCUMENTS

| | | | |
|---|---|---|---|
| 5,854,507 A * | 12/1998 | Miremadi et al. ............ | 257/686 |
| 6,049,129 A | 4/2000 | Yew et al. | |
| 6,445,594 B1 * | 9/2002 | Nakagawa et al. ........... | 361/776 |
| 6,642,610 B2 * | 11/2003 | Park et al. ..................... | 257/678 |

(Continued)

OTHER PUBLICATIONS

Package-on-Package Variations on the Horizon; Flynn Carson, STATS ChipPAC Inc., Fremont, CA—Semiconductor International, May 1, 2008; 6 pages.

*Primary Examiner* — Nikolay Yushin (57) ABSTRACT

An integrated circuit (IC) package including a substrate, a first IC, and a second IC adjacent to the first IC. The substrate includes first and second surfaces respectively having first and second bond pads, and an opening offset relative to a center of the substrate and extending from the first surface to the second surface. The first IC includes a third surface having third bond pads accessible through the opening. The second IC includes fourth and fifth surfaces respectively having fourth and fifth bond pads. The third and fifth surfaces are attached to the second surface. At least one of the third bond pads is connected to at least one of the first bond pads using one or more bond wires extending through the opening. At least one of the fourth bond pads is connected to at least one of the second bond pads using one or more bond wires.

17 Claims, 10 Drawing Sheets

(56) References Cited

U.S. PATENT DOCUMENTS

| | | | |
|---|---|---|---|
| 6,917,107 B2* | 7/2005 | Akram | 257/738 |
| 7,368,319 B2* | 5/2008 | Ha et al. | 438/109 |
| 7,432,599 B2* | 10/2008 | Verma et al. | 257/777 |
| 7,518,226 B2* | 4/2009 | Cablao et al. | 257/686 |
| 7,851,899 B2* | 12/2010 | Chen et al. | 257/686 |
| 2007/0246840 A1 | 10/2007 | Chye et al. | |
| 2008/0006948 A1 | 1/2008 | Wu et al. | |
| 2009/0108425 A1* | 4/2009 | Lee et al. | 257/679 |

* cited by examiner

STACKED INTEGRATED CIRCUIT PACKAGE USING A WINDOW SUBSTRATE

CROSS-REFERENCE TO RELATED APPLICATIONS

This application is a continuation of U.S. patent application Ser. No. 12/565,430, filed Sep. 23, 2009, which claims the benefit of U.S. Provisional Application Nos. 61/099,355, filed Sep. 23, 2008 and 61/121,018, filed Dec. 9, 2008. The entire disclosures of the above applications are incorporated herein by reference.

FIELD

The present disclosure relates to integrated circuit packages, and more particularly to integrated circuit packages including multiple integrated circuits stacked on a window substrate.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An integrated circuit (IC) package includes an IC. The IC may include analog and/or digital circuits. Analog circuits may include, but are not limited to, operational amplifiers, sensors, and analog-to-digital converters. Digital circuits may include, but are not limited to, combinational logic, microprocessors, memory, and external interface circuits. The IC may include a system-on-chip (SoC) that includes multiple analog/digital circuits. For example, the SoC may include microprocessors, memory, analog-to-digital converters, and operational amplifiers.

The IC may be attached to a substrate. Throughout the disclosure, the term "attach" refers to a bonding of two surfaces with a bonding material. For example, a die attach paste may attach a surface of the IC to a surface of the substrate. The IC may be connected to IC package leads and may be encapsulated. The IC package leads typically connect the IC to a printed circuit board (PCB). The PCB may include other IC packages and/or discrete components that may communicate with the IC.

Figure 1A:
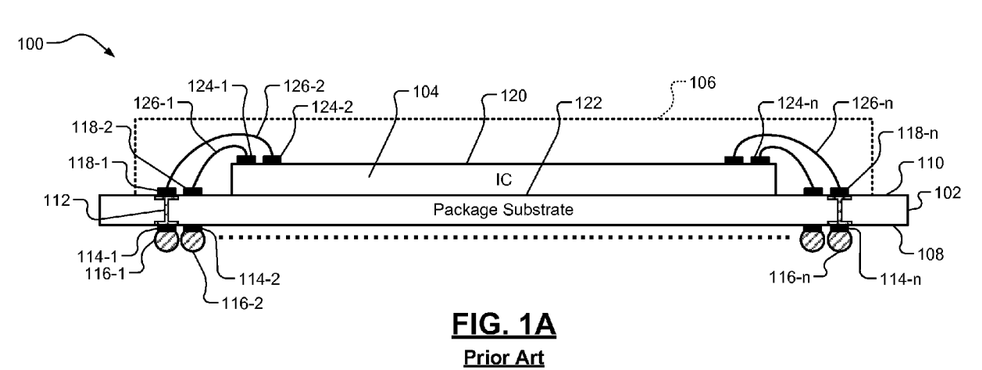
FIG. 1A is a schematic of an integrated circuit (IC) package.

Referring now to FIG. 1A, an IC package 100 includes a package substrate 102, an IC 104, and an encapsulant 106. The package substrate 102 includes a PCB bonding surface 108, an IC bonding surface 110, and substrate interconnects 112. The PCB bonding surface 108 includes PCB bond pads 114-1, 114-2, . . . , and 114-n (collectively PCB bond pads 114). The IC 104 may connect to the PCB or another IC (both not shown) through the PCB bond pads 114.

The PCB bond pads 114 may be connected to the PCB using solder balls 116-1, 116-2, . . . , and 116-n (collectively solder balls 116). The PCB bond pads 114 and the solder balls 116 may include any bonding structure suitable for connecting the IC package 100 to the PCB or to another IC package. For example only, the PCB bond pads 114 and the solder balls 116 may include a ball grid array (BGA) with solder balls 116. The PCB bond pads 114 and the solder balls 116 may also include a land grid array (LGA) without solder balls 116.

The IC bonding surface 110 includes substrate bond pads 118-1, 118-2, . . . , and 118-n (collectively substrate bond pads 118). The substrate bond pads 118 are connected to the PCB bond pads 114 through the substrate interconnects 112. The substrate interconnects 112 include conductive traces and conductive vias that are integral to the package substrate 102. The package substrate 102 may include a single layer of conductive traces or multiple layers of conductive traces. For example only, the conductive traces may be located on the PCB bonding surface 108 and the IC bonding surface 110. The conductive vias may connect the conductive traces of the PCB bonding surface 108 and the conductive traces of the IC bonding surface 110.

The IC 104 includes an IC top surface 120 and an IC bottom surface 122. The IC bottom surface 122 is attached to the IC bonding surface 110 of the package substrate 102. The IC 104 may be attached to the package substrate 102 using any suitable adhesive. For example only, the adhesive may include a die attach paste or a die bonding film. The IC top surface 120 includes IC bond pads 124-1, 124-2, . . . , and 124-n (collectively IC bond pads 124). The IC bond pads 124 are connected to the substrate bond pads 118 using bonding wires 126-1, 126-2, . . . , and 126-n (collectively bonding wires 126). The IC 104 is covered with the encapsulant 106. The encapsulant 106 protects the IC 104 from physical damage and corrosion. The encapsulant 106 may be ceramic or polymer based.

The IC bond pads 124 may be connected to the PCB bond pads 114 in numerous ways. A single IC bond pad 124 may be connected to a single PCB bond pad 114. A single IC bond pad 124 may be connected to a plurality of the PCB bond pads 114. A plurality of the IC bond pads 124 may be connected to a single PCB bond pad 114.

Throughout the disclosure the term "top surface" refers to a surface of an IC that includes IC bond pads 124. Throughout the disclosure the term "bottom surface" refers to a surface of the IC that may not include IC bond pads 124. For example, as shown in FIG. 1A, the IC top surface 120 includes IC bond pads 124 and the IC bottom surface 122 does not include IC bond pads 124.

Figure 1B:
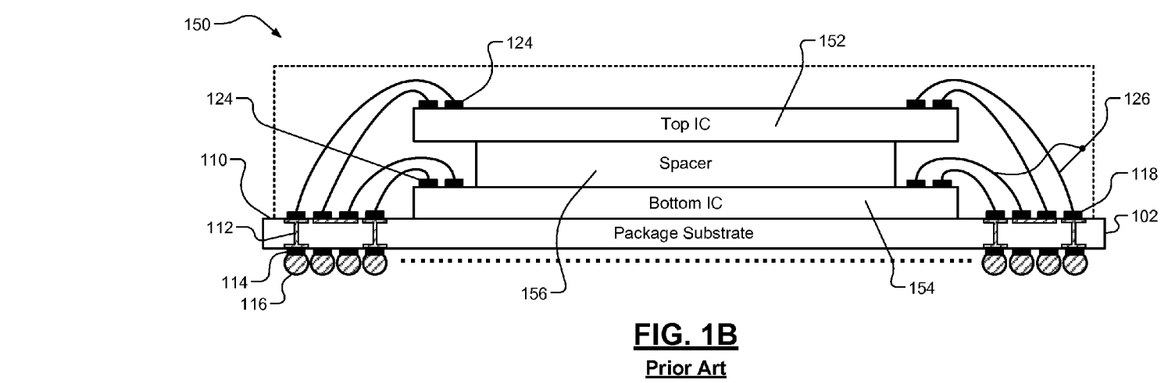
FIG. 1B is a schematic of a stacked IC package.

Referring now to FIG. 1B, a stacked IC package 150 includes the package substrate 102, a top IC 152, a bottom IC 154, and a spacer 156. The IC bottom surface of the bottom IC 154 is attached to the IC bonding surface 110 of the package substrate 102. The spacer 156 is attached to the IC top surface of the bottom IC 154 and the IC bottom surface of the top IC 152. The spacer 156 provides structural support for the top IC 152. The spacer 156 may also provide clearance for the bonding wires 126 that connect the bottom IC 154 to the substrate bond pads 118. The spacer 156 may include an insulating material such as oxidized silicon.

The IC bond pads 124 of the top IC 152, the IC bond pads 124 of the bottom IC 154, and the PCB bond pads 114 of the package substrate 102 may be connected in numerous ways. The IC bond pads 124 of the top IC 152 may be connected to the IC bond pads 124 of the bottom IC 154 through the substrate interconnects 112. The IC bond pads 124 of the top IC 152 may be connected to the PCB bond pads 114 through the substrate interconnects 112. The IC bond pads 124 of the bottom IC 154 may be connected to the PCB bond pads 114 through the substrate interconnects 112.

Figure 2A:
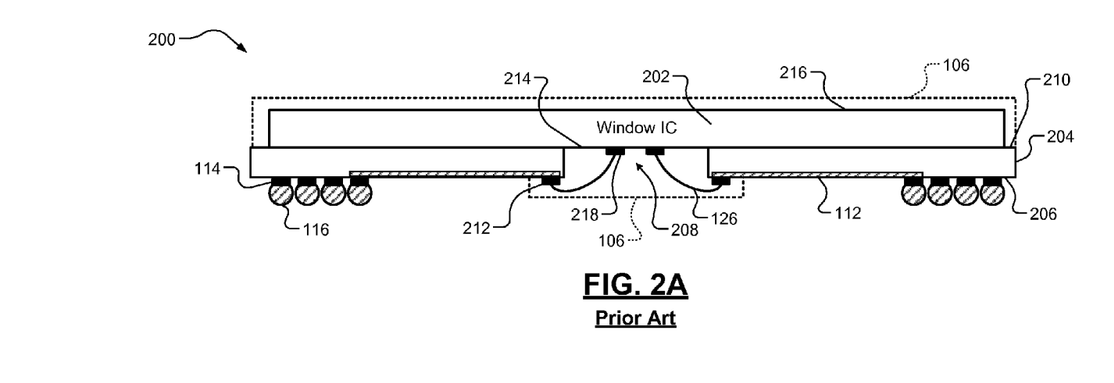
FIG. 2A is a schematic of a window IC package.

Referring now to FIG. 2A, a window IC package 200 includes a package substrate 204 having a window 208. The package substrate 204 is hereinafter called a window package substrate 204. The window 208 is hereinafter called a substrate window 208. The window IC package 200 further includes an IC 202 that is attached to the window package substrate 204. The IC 202 is hereinafter called a window IC 202. The encapsulant 106 encapsulates the window package substrate 204 and the window IC 202.

The window package substrate 204 includes a window PCB bonding surface 206 and a package IC bonding surface 210. The window PCB bonding surface 206 may include the PCB bond pads 114 and window bond pads 212. The substrate window 208 is an opening defined by the window package substrate 204. The substrate window 208 extends from the window PCB bonding surface 206 to the package IC bonding surface 210. The substrate window 208 allows for connection of the window bond pads 212 to the window IC 202 using bonding wires 126.

The window IC 202 includes a window IC top surface 214 and a window IC bottom surface 216. The window IC top surface 214 is attached to the package IC bonding surface 210. The window IC top surface 214 includes window IC bond pads 218. The window IC bond pads 218 are accessible through the substrate window 208. The window IC bond pads 218 may be connected to the window bond pads 212 using bonding wires 126 that pass through the substrate window 208. The window bond pads 212 may be connected to the PCB bond pads 114 through the substrate interconnects 112. The window bond pads 212, the window IC bond pads 218, and the substrate window 208 may be covered by the encapsulant 106. For example only, the encapsulant 106 may include an epoxy.

Throughout the disclosure, the term "window IC top surface" refers to a surface of the window IC 202 that includes window IC bond pads 218. Throughout the disclosure, the term "window IC bottom surface" refers to a surface of the window IC 202 that may not include window IC bond pads 218. For example, as shown in FIG. 2A, the window IC top surface 214 includes the window IC bond pads 218 and the window IC bottom surface 216 does not include the window IC bond pads 218.

Figure 2B:
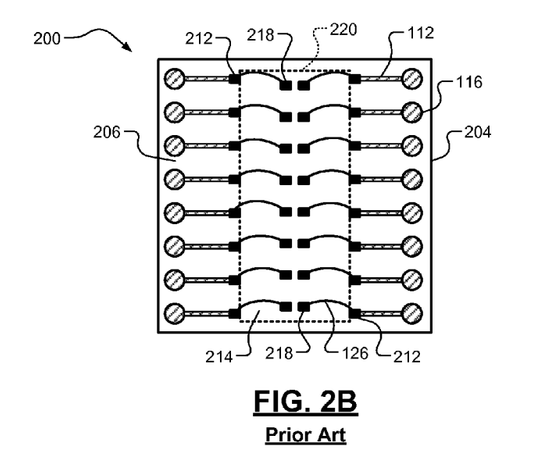
FIG. 2B is a schematic of a window IC package viewed from a window PCB bonding surface.

Referring now to FIG. 2B, the window bond pads 212 are located at a perimeter 220 of the substrate window 208. The window bond pads 212 are connected to the window IC bond pads 218 using bonding wires 126. The window bond pads 212 are connected to the PCB bond pads 114 and solder balls 116 on two sides of the perimeter 220 through the substrate interconnects 112.

Figure 3:
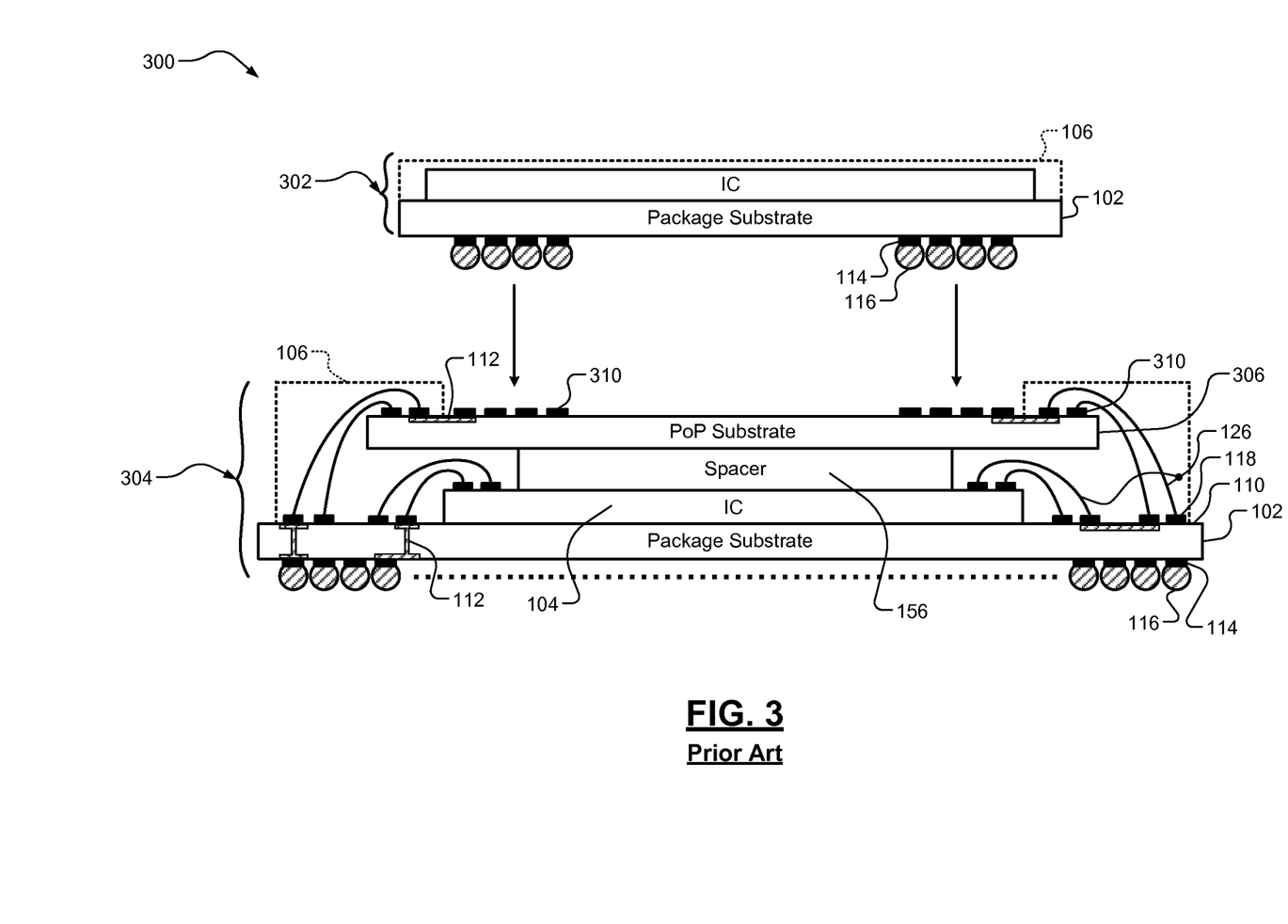
FIG. 3 is a schematic of a package-on-package stack.

Referring now to FIG. 3, ICs may be stacked in a package-on-package (PoP) configuration. A PoP stack 300 includes a top IC package 302 and a bottom IC package 304. The bottom IC package 304 includes the package substrate 102, the IC 104, the spacer 156, and a PoP substrate 306. The IC bottom surface of the IC 104 is attached to the IC bonding surface 110 of the package substrate 102. The spacer 156 is attached to the IC top surface of the IC 104. The PoP substrate 306 is attached to the spacer 156.

The PoP substrate 306 includes PoP substrate bond pads 310 and the substrate interconnects 112. The solder balls 116 may connect the PCB bond pads 114 of the top IC package 302 to the PoP substrate bond pads 310. The bonding wires 126 may connect the PoP substrate bond pads 310 to the substrate bond pads 118. An IC of the top IC package 302 may connect to the IC 104 and the PCB bond pads 114 of the package substrate 102 through the substrate interconnects 112 of the package substrate 102. The IC 104 may connect to the PCB bond pads 114 of the package substrate 102 through the substrate interconnects 112 of the package substrate 102.

SUMMARY

An integrated circuit (IC) package is disclosed. The IC package includes a first substrate having a first surface having first substrate bond pads, a second surface having second substrate bond pads, and an opening that extends from the first surface to the second surface. The IC package further includes a first IC having a first IC surface that includes first bond pads and that is directly attached to the second surface of the first substrate, and a second IC surface. The first bond pads are accessible through the opening. The IC package also includes a second IC having a third IC surface that is directly attached to the second IC surface, and a fourth IC surface that includes second bond pads. At least one of the first bond pads is connected to at least one of the first substrate bond pads using one or more bond wires. At least one of the second bond pads is connected to at least one of the second substrate bond pads using one or more bond wires. The opening has a first side and a second side. The first substrate bond pads are located adjacent to only the first side of the opening.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Typically, as shown in FIG. 1B, the stacked IC package 150 includes the spacer 156 between the top IC 152 and the bottom IC 154. The spacer 156 provides clearance for the bonding wires 126 when the top IC 152 covers the bond pads 124 of the bottom IC 154. The spacer 156 increases thickness of the stacked IC package 150. A stacked window IC package according to the present disclosure eliminates the spacer 156. Therefore, the stacked window IC package according to the present disclosure may be thinner than the stacked IC package 150.

Additionally, the stacked window IC package according to the present disclosure includes an opening in a package substrate. The top surface of the bottom IC may be attached to the package substrate. The bottom surface of the bottom IC may be attached to the bottom surface of the top IC. The bottom IC may be connected to the top IC through the opening.

The stacked window IC package of the present disclosure may reduce a length of connections between the top IC and the bottom IC. The bottom IC may connect to the package substrate on a single side of the opening. The top IC may be offset towards the single side of the opening. The bottom IC and the top IC may communicate through the single side of the package substrate to reduce the length of connection between the top IC and the bottom IC.

The shorter connection between the top IC and the bottom IC may reduce an amount of termination resistance used for impedance matching between the top IC and the bottom IC. The reduction in termination resistance may reduce power consumption of the stacked window IC package. Additionally, the shorter connection may reduce crosstalk and signal noise. The shorter connection may also provide for shorter wire bonds that have a reduced probability of mechanical failure.

Figure 4:
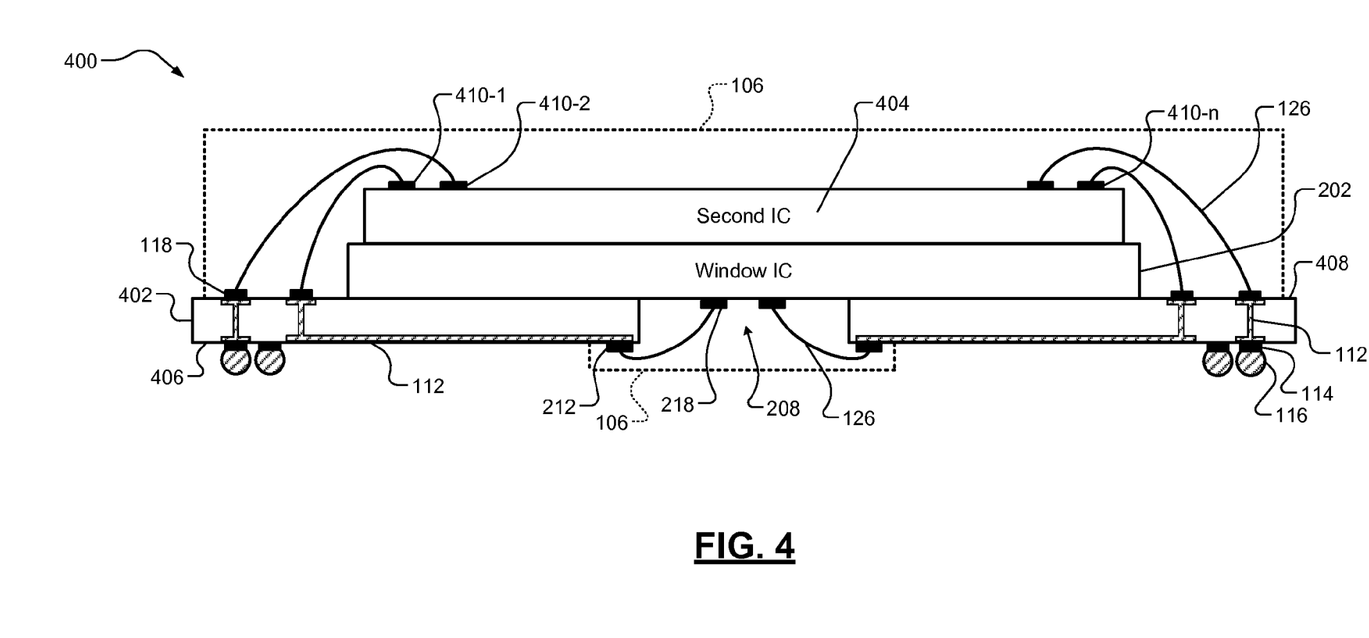
FIG. 4 is a schematic of a stacked window IC package according to the present disclosure.
Figure 5A:
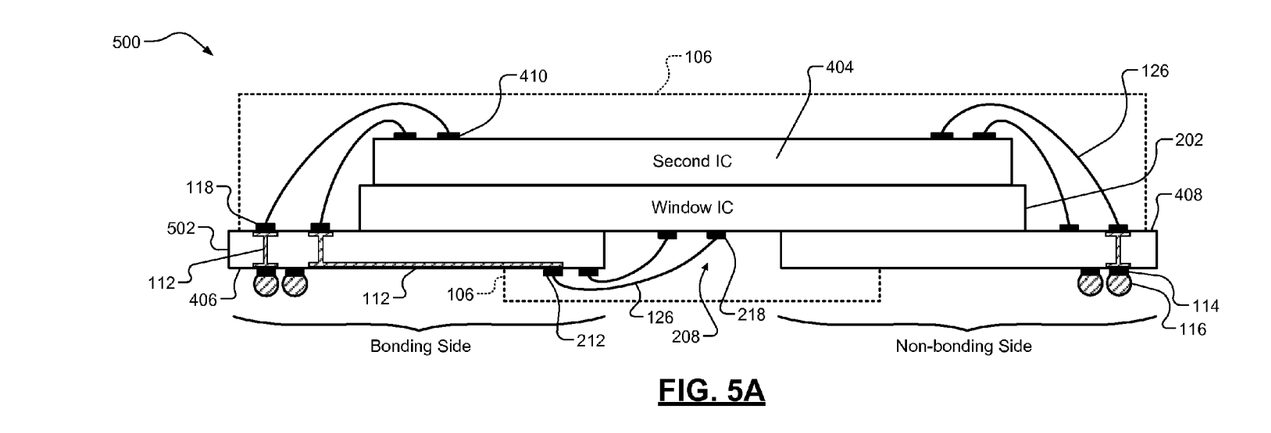
FIG. 5A is a schematic of a single-sided window IC package according to the present disclosure.
Figure 5B:
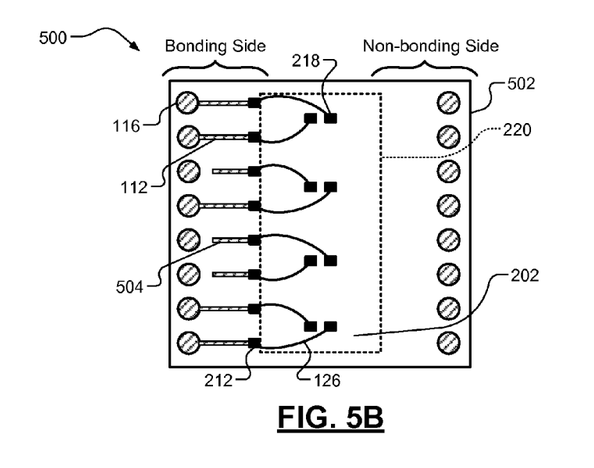
FIG. 5B is a schematic of a single-sided window IC package viewed from a window bonding surface according to the present disclosure.
Figure 6A:
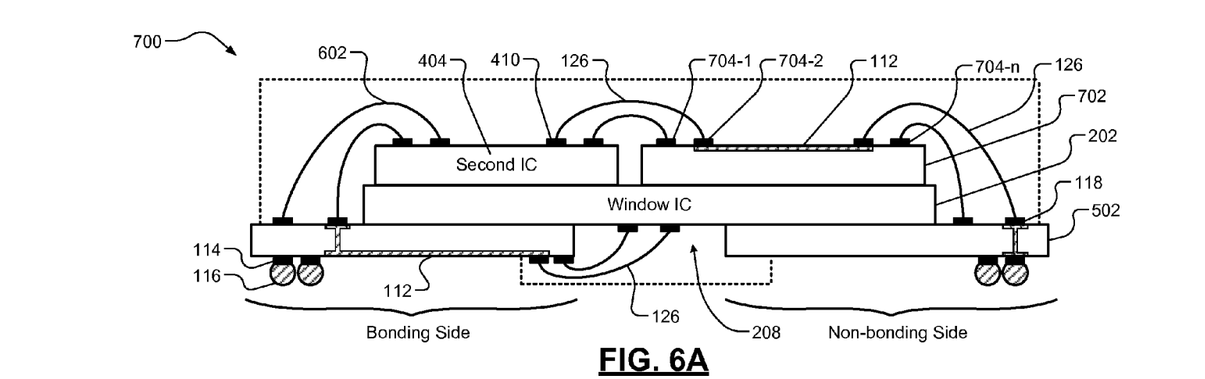
FIG. 6A is a schematic of a fan-out window IC package according to the present disclosure.
Figure 6B:
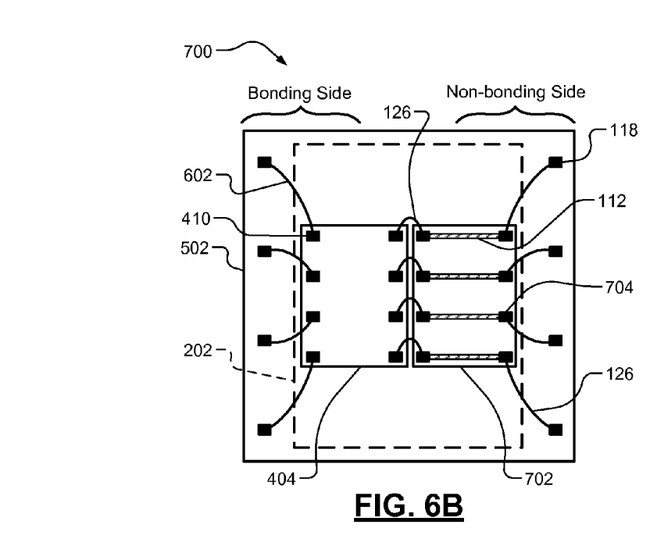
FIG. 6B is a schematic of a fan-out window IC package viewed from a window IC bonding surface according to the present disclosure.
Figure 6C:
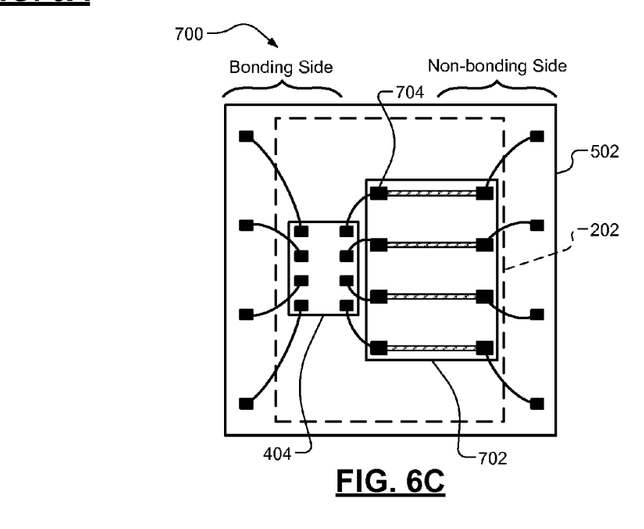
FIG. 6C is a schematic of a fan-out window IC package viewed from a window IC bonding surface according to the present disclosure.
Figure 7A:
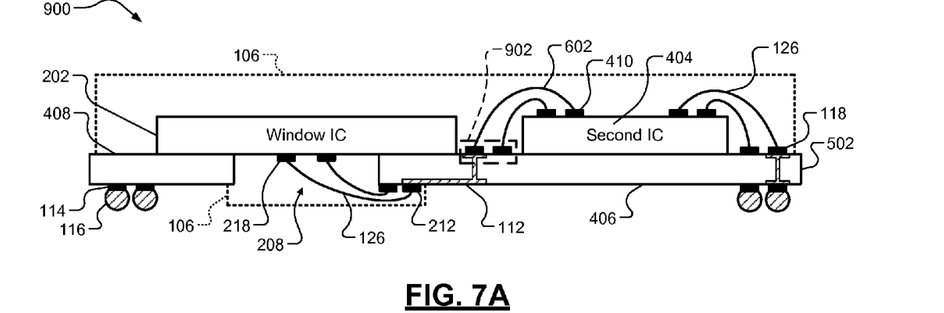
FIG. 7A is a schematic of a side-by-side window IC package according to the present disclosure.
Figure 7B:
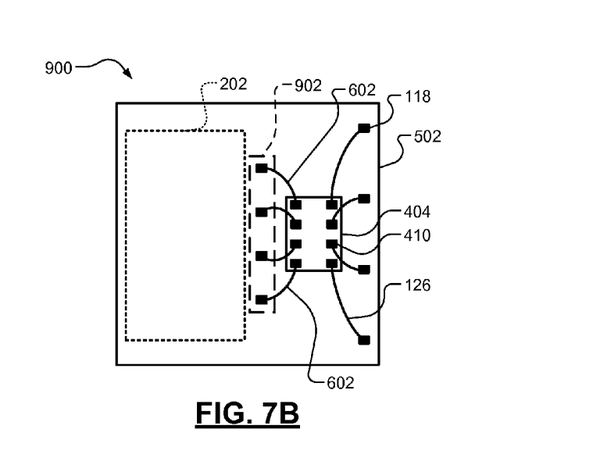
FIG. 7B is a schematic of a side-by-side window IC package viewed from a window IC bonding surface according to the present disclosure.
Figure 7C:
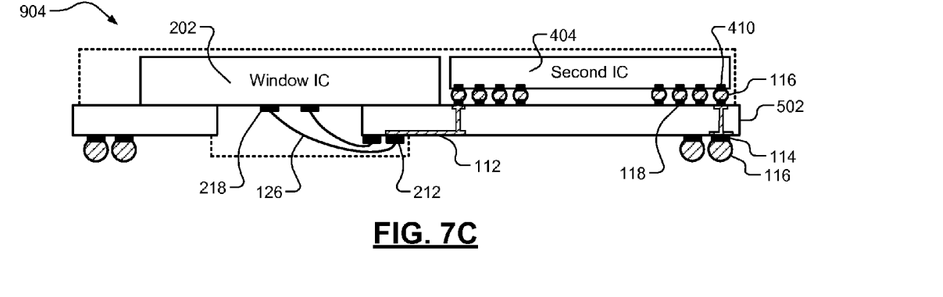
FIG. 7C is a schematic of a side-by-side window IC package including a flip chip IC according to the present disclosure.
Figure 8A:
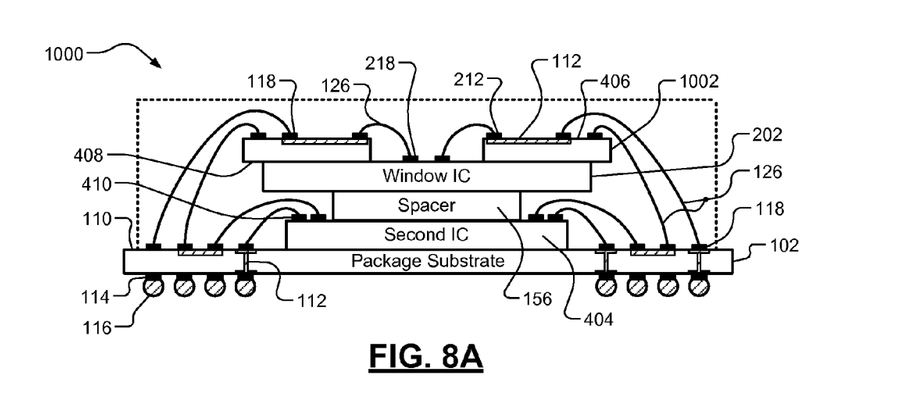
FIG. 8A is a schematic of an inverted window IC package according to the present disclosure.
Figure 8B:
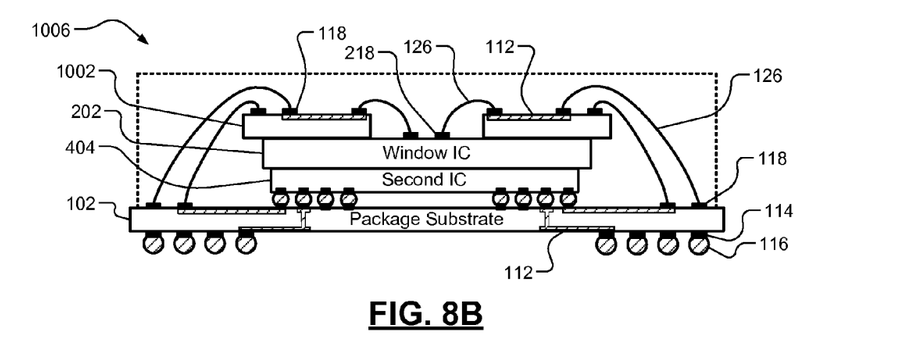
FIG. 8B is a schematic of an inverted window IC package including a flip chip IC according to the present disclosure.
Figure 8C:
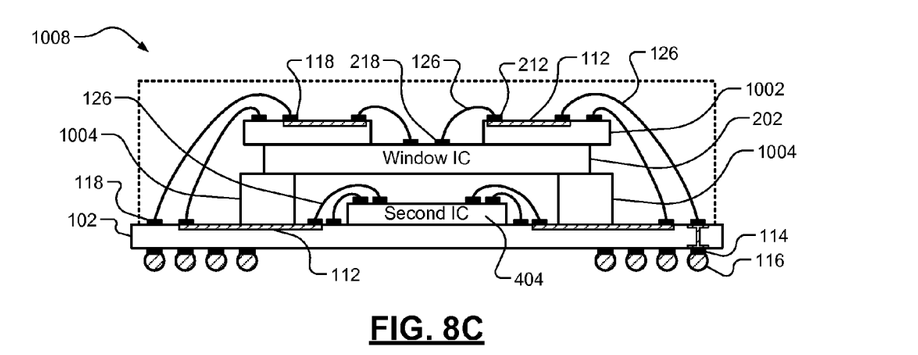
FIG. 8C is a schematic of an inverted window IC package including an alternative spacer according to the present disclosure.
Figure 9A:
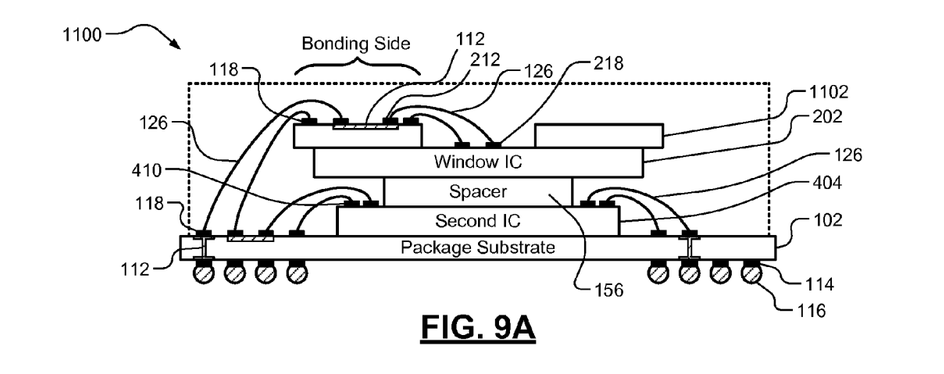
FIG. 9A is a schematic of an inverted window IC package including a single-sided inverted substrate according to the present disclosure.
Figure 9B:
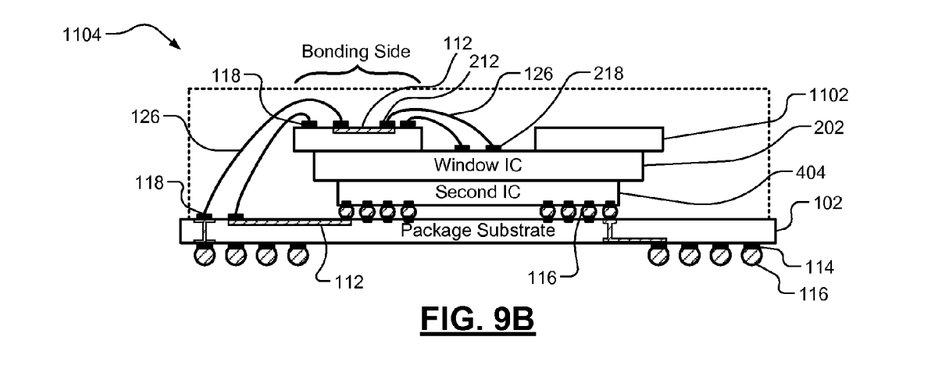
FIG. 9B is a schematic of an inverted window IC package including a single-sided inverted substrate and a flip chip IC according to the present disclosure.
Figure 9C:
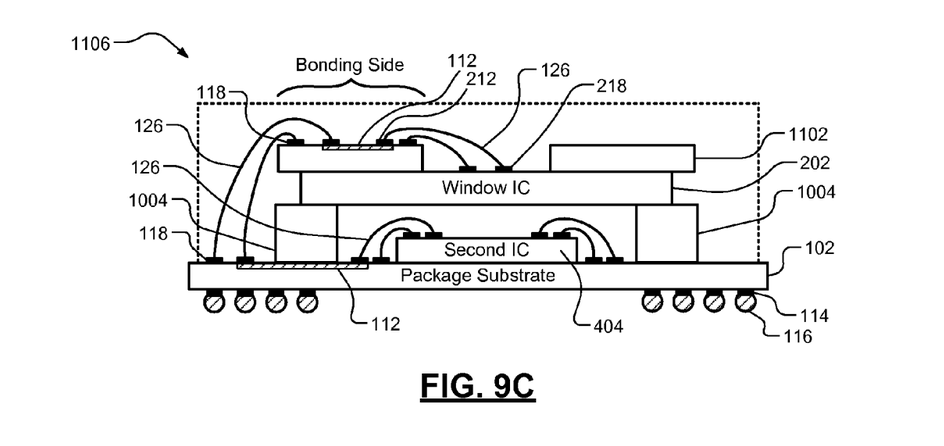
FIG. 9C is a schematic of an inverted window IC package including a single-sided inverted substrate and an alternative spacer according to the present disclosure.
Figure 10A:
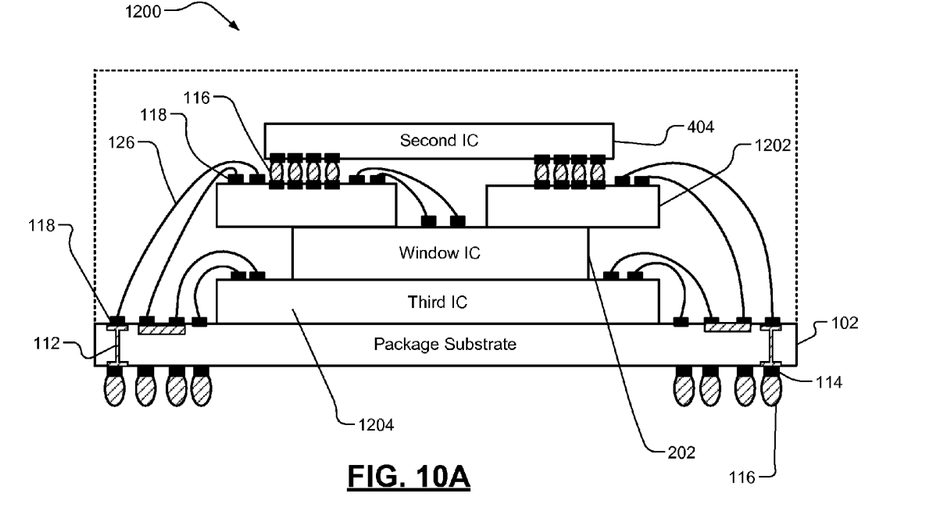
FIG. 10A is a schematic of an inverted window IC package including a flip chip IC located on top of a window IC and another IC according to the present disclosure.
Figure 10B:
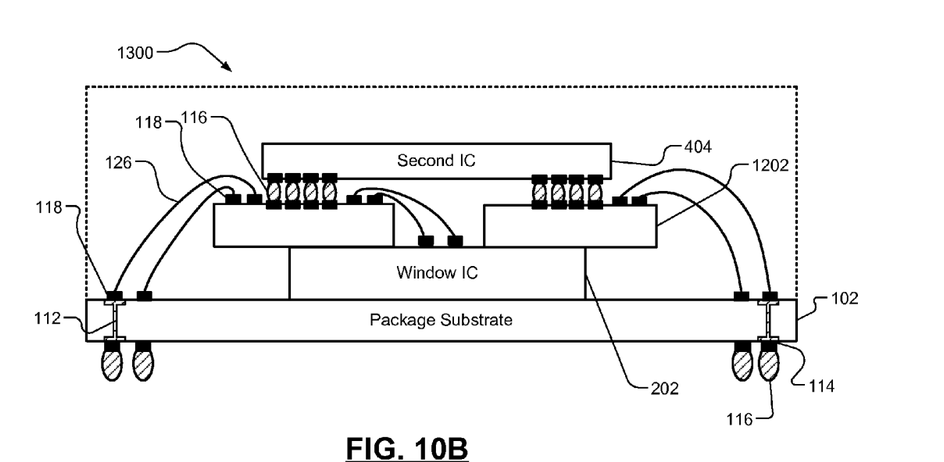
FIG. 10B is a schematic of an inverted window IC package including a flip chip IC located on top of a window IC according to the present disclosure.

Before a more detailed discussion, a brief description of the drawings is presented. FIG. 4 shows a stacked window IC package that includes a window IC that is connected to a second IC through a substrate window. FIGS. 5A and 5B show a stacked window IC package that includes a window IC that is connected to a second IC through a single side of the substrate window. FIGS. 6A, 6B, and 6C show a fan-out window IC package including a fan-out substrate used to reduce bonding wire length. FIGS. 7A, 7B, and 7C show a side-by-side window IC package including a window IC and a second IC attached to a substrate having connections on a single side of the substrate window. The side-by-side window IC package includes a portion of bond pads between the second IC and the window IC. FIGS. 8A, 8B, and 8C show an inverted window IC package including an inverted substrate. FIGS. 9A, 9B, and 9C show an inverted window IC package including an inverted substrate having connections on a single side of the substrate window. FIGS. 10A and 10B show an inverted window IC package including a flip chip IC.

Referring now to FIG. 4, a stacked window IC package 400 includes a window substrate 402, the window IC 202, and a second IC 404. The window substrate 402 includes a window bonding surface 406, the substrate window 208, and a window IC bonding surface 408. The window bonding surface 406 may include the PCB bond pads 114 and the window bond pads 212. The window IC bonding surface 408 includes the substrate bond pads 118. The substrate bond pads 118 may be located at a periphery of the window substrate 402.

The window IC 202 includes the window IC top surface and the window IC bottom surface. The window IC top surface is attached to the window IC bonding surface 408. The window IC top surface includes the window IC bond pads 218. The window IC bond pads 218 are accessible through the substrate window 208. The window IC bond pads 218 may connect to the window bond pads 212 using bonding wires 126 that pass through the substrate window 208. The window bond pads 212 may connect to the PCB bond pads 114 through the substrate interconnects 112. The window bond pads 212, the window IC bond pads 218, and the substrate window 208 may be covered with the encapsulant 106 (e.g., epoxy).

The IC bottom surface of the second IC 404 is attached to the window IC bottom surface. The IC bottom surface of the second IC 404 may be attached to the window IC bottom surface using any suitable adhesive. For example only, the suitable adhesive may include a die attach paste or a die bonding film.

The stacked window IC package 400 allows for integration of multiple ICs in a package having a reduced profile. The term "profile" refers to the thickness or height of the package due to the stacking of the ICs, substrates, spacers, and encapsulant. The stacked window IC package 400 may have a reduced profile relative to the stacked IC package 150. For example, while the stacked IC package 150 may include the spacer 156 that increases thickness of the stacked IC package 150, the stacked window IC package 400 may eliminate the spacer 156.

The IC top surface of the second IC 404 includes second IC bond pads 410-1, 410-2, . . . , and 410-n (collectively second IC bond pads 410). The second IC bond pads 410 may connect to the substrate bond pads 118 using bonding wires 126. The second IC bond pads 410, the window IC bond pads 218, and the PCB bond pads 114 may be connected in numerous ways. The second IC bond pads 410 may connect to the window IC bond pads 218 and the PCB bond pads 114 through the substrate interconnects 112. The window IC bond pads 218 may connect to the PCB bond pads 114 through the substrate interconnects 112.

The stacked window IC package 400 may include a memory IC and a system-on-chip (SoC). The window IC 202 may be the memory IC, and the second IC 404 may be the SoC. For example only, the memory IC may include a dynamic random access memory (DRAM) IC. The DRAM IC may be attached to the window IC bonding surface 408. The bond pads of the DRAM IC may be accessible through the substrate window 208. The SoC may communicate with the DRAM IC through the substrate interconnects 112. The stacked window IC package 400 may be connected to a PCB that includes other IC packages and/or discrete components. The SoC may communicate with other IC packages and/or discrete components on the PCB. The other IC packages and/or discrete components on the PCB may also communicate with the DRAM IC through the substrate interconnects 112.

Alternatively, the stacked window IC package 400 may include memory ICs. For example only, the stacked window IC package 400 may include the DRAM IC and a non-volatile memory IC (e.g., flash memory). The window IC 202 may be the DRAM IC, and the second IC 404 may be the non-volatile memory IC. The memory ICs in the stacked window IC package 400 may have a reduced package profile. Other IC packages and/or discrete components on the PCB may communicate with the memory ICs.

Referring now to FIGS. 5A and 5B, a single-sided window IC package 500 is shown. In FIGS. 5A and 5B, the single-sided window IC package 500 includes the window IC 202, the second IC 404, and a single-sided window substrate 502. The single-sided window substrate 502 includes the window bond pads 212 along a single side of the substrate window 208. A side of the single-sided window substrate 502 including the window bond pads 212 may be called a "bonding side" of the single-sided window substrate 502. A side of the single-sided window substrate 502 that does not include the window bond pads 212 may be called a "non-bonding side" of the single-sided window substrate 502. The bonding side and the non-bonding side are shown in detail in FIG. 5B. The bonding wires 126 connect the window IC bond pads 218 to the window bond pads 212. The window bond pads 212 connect to the PCB bond pads 114 and the substrate bond pads 118 through the substrate interconnects 112. The second IC 404 may connect to the PCB bond pads 114 and the window IC 202 through the substrate interconnects 112.

In FIG. 5B, the window bond pads 212 are located along a single side of the perimeter 220 of the substrate window 208 (i.e., the bonding side). While the perimeter 220 shown is a rectangle, other shapes are anticipated. The bonding wires 126 connect the window bond pads 212 to the window IC bond pads 218. While the window IC bond pads 218 of FIG. 5B are organized in two rows, other layouts are anticipated.

As shown in FIG. 5B, the window bond pads 212 may connect to the PCB bond pads 114 and solder balls 116 through substrate interconnects 112 on the window bonding surface 406. The window bond pads 212 may also connect to the second IC 404 through substrate interconnects 112 that pass from the window bonding surface 406 to the window IC bonding surface 408 as indicated at 504.

Referring now to FIGS. 6A-6C, a fan-out window IC package 700 is shown. In FIG. 6A, the fan-out window IC package 700 includes the single-sided window substrate 502, the window IC 202, the second IC 404, and a fan-out substrate 702. Alternatively, the fan-out window IC package 700 may include the window substrate 402 in place of the single-sided window substrate 502. The fan-out substrate 702 includes fan-out bond pads 704-1, 704-2, . . . , and 704-*n* (collectively fan-out bond pads 704) and the substrate interconnects 112. The fan-out substrate 702 may be a single or multi-layered structure that includes conductive traces and vias that connect the fan-out bond pads 704. For example, the fan-out substrate 702 may include a single or multi-layered PCB. The substrate interconnects 112 may connect the fan-out bond pads 704. The fan-out substrate 702 is attached to the window IC bottom surface. The fan-out substrate 702 is positioned adjacent to the second IC 404.

The bonding wires 126 connect the second IC bond pads 410 to the fan-out bond pads 704. The bonding wires 126 that connect the fan-out bond pads 704 to the second IC 404 and the bonding wires 126 that connect the fan-out substrate 702 to the substrate bond pads 118 may be called "fan-out bonding wires." The fan-out bond pads 704 are connected to the substrate bond pads 118 using bonding wires 126. The fan-out substrate 702 may reduce the length of the bonding wires 126 that connect the second IC bond pads 410 to the substrate bond pads 118. For example, the fan-out bonding wires may be shorter than bonding wires that would otherwise be needed to connect the second IC bond pads 410 directly with the substrate bond pads 118.

In FIG. 6B, the fan-out substrate 702 is adjacent to the second IC 404. The outline of the fan-out substrate 702 is similar to the outline of the second IC 404. The second IC bond pads 410 may be connected to the substrate bond pads 118 using two fan-out bonding wires 126 and the substrate interconnects 112 of the fan-out substrate 702. The second IC bond pads 410 may also be connected to the substrate bond pads 118 using the short bonding wires 602 when a distance between the second IC bond pads 410 and the substrate bond pads 118 allows.

In FIG. 6C, the fan out substrate 702 is placed adjacent to the second IC 404. The outline of the second IC 404 is smaller than the outline of the fan-out substrate 702. The term "outline" refers to the length and width of the IC top/bottom surfaces. In other words, the term "outline" refers to the area of the IC. The bonding wires of different lengths may be described as short bonding wires and long bonding wires. The terms "short" and "long" may describe the relative lengths of the bonding wires.

Although FIG. 6B and FIG. 6C depict the second IC 404 with a similar/smaller outline than the fan-out substrate 702, respectively, the second IC 404 may have a larger outline than the fan-out substrate 702.

The fan-out window IC package 700 may include the DRAM IC and the SoC. The DRAM IC may be attached to the single-sided window substrate 502 and the SoC may be attached to the DRAM IC. The DRAM IC may include rows of bond pads that are centrally located on the top surface of the DRAM IC. The rows of bond pads are accessible through the substrate window 208. The bond pads of the DRAM IC may be connected to the window bond pads 212. The SoC may have a smaller outline than the DRAM IC and therefore may be offset towards the bonding side of the single-sided window substrate 502. The offset of the SoC towards the bonding side allows the SoC to be attached to the single-sided window substrate 502 using short bonding wires 602.

The DRAM IC may communicate with the SoC through the short bonding wires 602. Connection of the SoC and the DRAM IC using short bonding wires 602 reduces an amount of termination resistance used for impedance matching between the DRAM IC and the SoC. The reduction in termination resistance may reduce power dissipation of the fan-out window IC package 700. Additionally, the shorter connection between the DRAM IC and the SoC may reduce crosstalk and signal noise.

Referring now to FIG. 7A, a side-by-side window IC package 900 includes the window IC 202, the second IC 404, the single-sided window substrate 502, and the encapsulant 106. Although not shown, the window substrate 402 may be used instead of the single-sided window substrate 502. The single-sided window substrate 502 includes the window bonding surface 406 and the window IC bonding surface 408. The window bonding surface 406 includes the window bond pads 212 and the PCB bond pads 114.

The window IC bonding surface 408 includes the substrate bond pads 118. The window IC top surface is attached to the window IC bonding surface 408 so that the window IC bond pads 218 are accessible through the substrate window 208. The IC bottom surface of the second IC 404 is attached to the window IC bonding surface 408. The second IC 404 is attached to the window IC bonding surface 408 adjacent to the window IC 202.

A plurality of the substrate bond pads 118 is located between the window IC 202 and the second IC 404. Hereinafter, a substrate bond pad 118 included in the plurality of the substrate bond pads 118 is called a substrate bond pad 902. The window bond pads 212 connect to the substrate bond pads 902 through the substrate interconnects 112. The second IC 404 connects to the substrate bond pads 902 using short bonding wires 602. The window IC bond pads 218 may be connected to the window bond pads 212 using bonding wires 126. The second IC bond pads 410 may be connected to the substrate bond pads 118 using bonding wires 126.

Referring now to FIG. 7B, an exemplary layout of the substrate bond pads 902 is shown. Although the outline of the second IC 404 is smaller than the outline of the window IC 202, other outlines are anticipated. For example, the outline of the window IC 202 may be similar to or smaller than the outline of the second IC 404.

The window IC 202 and the second IC 404 may be connected in numerous ways. The window IC 202 may connect to the PCB bond pads 114 and the substrate bond pads 118, 902. The second IC 404 may connect to the PCB bond pads 114 and the substrate bond pads 118, 902. The second IC 404 and the window IC 202 may communicate through the substrate interconnects 112 and the substrate bond pads 902. For example only, the second IC 404 and the window IC 202 may communicate only through the substrate bond pads 902.

The side-by-side window IC package 900 may include the DRAM IC and the SoC. The DRAM IC and the SoC may be attached to the window IC bonding surface 408 of the single-sided window substrate 502. The DRAM IC may include rows of bond pads that are accessible through the substrate window 208. The bond pads of the DRAM IC may be connected to the window bond pads 212. The SoC may connect to the DRAM IC through the substrate bond pads 902. The SoC may be proximate to the substrate bond pads 902 to reduce the length of the short bonding wires 602. The bond pads on the SoC that connect to the substrate bond pads 902 may also be proximate to the substrate bond pads 902 to further reduce the length of the short bonding wires 602. Thus, the side-by-side window IC package 900 reduces the length of the short bonding wires 602 used to connect the DRAM IC and the SoC. The side-by-side window IC package 900 also provides a package with a reduced profile.

Referring now to FIG. 7C, a side-by-side window IC package 904 includes the second IC 404 in a flip chip configuration. The second IC bond pads 410 may be connected to the substrate bond pads 118 in the flip chip configuration. In the flip chip configuration, the second IC bond pads 410 may be connected to the substrate bond pads 118 using solder balls 116. The second IC 404 may also be attached to the single-sided window substrate 502 using any suitable adhesive. For example, the second IC 404 may be underfilled with any suitable adhesive.

The second IC 404 may communicate with the window IC 202 through the substrate bond pads 118 that are nearest to the window bond pads 212 to provide a short connection length. The second IC 404 in the flip chip configuration may have a reduced outline and a reduced profile relative to the second IC 404 that is connected using short bonding wires 602. The reduced outline and the reduced profile of the second IC 404 in the flip chip configuration may allow for a reduced package outline and a reduced package profile.

Referring now to FIG. 8A, an inverted window IC package 1000 includes the package substrate 102, the second IC 404, the spacer 156, the window IC 202, and an inverted window substrate 1002. The IC bottom surface of the second IC 404 is attached to the IC bonding surface 110 of the package substrate 102. The spacer 156 is attached to the IC top surface of the second IC 404. The window IC bottom surface is attached to the spacer 156.

The inverted window substrate 1002 includes the window IC bonding surface 408 and the window bonding surface 406. The window IC bonding surface 408 of the inverted window substrate 1002 is attached to the window IC top surface. The window bonding surface 406 of the inverted window substrate 1002 includes the substrate bond pads 118 and the window bond pads 212. The window IC bond pads 218 are connected to the window bond pads 212 using bonding wires 126. The window bond pads 212 are connected to the substrate bond pads 118 of the inverted window substrate 1002 through the substrate interconnects 112 of the inverted window substrate 1002. The substrate bond pads 118 of the inverted window substrate 1002 are connected to the substrate bond pads 118 of the package substrate 102 using bonding wires 126.

The second IC bond pads 410 are connected to the substrate bond pads 118 of the package substrate 102 using bonding wires 126. The window IC 202 may be connected to the second IC 404 and the PCB bond pads 114 of the package substrate 102 through the substrate interconnects 112 of the package substrate 102. The second IC 404 may connect to the PCB bond pads 114 of the package substrate 102 through the substrate interconnects 112 of the package substrate 102.

Referring now to FIG. 8B, the second IC 404 may be connected in the flip chip configuration. The IC bottom surface of the second IC 404 may be attached to the window IC bottom surface when the second IC 404 is connected to the package substrate 102 in the flip chip configuration. An inverted window IC package 1006 including the second IC 404 in the flip chip configuration may eliminate the spacer 156. Accordingly, the inverted window IC package 1006 may have a reduced package profile relative to the inverted window IC package 1000.

Referring now to FIG. 8C, an inverted window IC package 1008 includes an alternative spacer 1004. The alternative spacer 1004 may support the window IC 202 when the outline of the second IC 404 is such that the spacer 156 will not support the window IC 202. The alternative spacer 1004 may include two separate spacer portions to support the window IC 202. The alternative spacer 1004 may also include a ring around the second IC 404. For example only, the second IC 404 may be an SoC, and the window IC 202 may be a DRAM IC. The outline of the DRAM IC may be larger than the outline of the SoC. Accordingly, the alternative spacer 1004 may be used to support the larger DRAM IC.

Referring now to FIG. 9A, an inverted window IC package 1100 includes a single-sided inverted substrate 1102. The single-sided inverted substrate 1102 includes the window bond pads 212 and the substrate bond pads 118 on the bonding side of the single-sided inverted substrate 1102. The substrate bond pads 118 and the window bond pads 212 of the single-sided inverted substrate 1102 are connected through the substrate interconnects 112. The substrate bond pads 118 of the single-sided inverted substrate 1102 may connect to the substrate bond pads 118 of the package substrate 102 using bonding wires 126. The window IC bond pads 218 may connect to the second IC bond pads 410 and the PCB bond pads 114 through the substrate interconnects 112 of the package substrate 102. The second IC bond pads 410 may connect to the PCB bond pads 114 through the bonding wires 126 and the substrate interconnects 112 of the package substrate 102.

Referring now to FIG. 9B, the second IC 404 may be connected in the flip chip configuration. The IC bottom surface of the second IC 404 may be attached to the window IC bottom surface when the second IC 404 is connected in the flip chip configuration. The inverted window IC package 1104 including the second IC 404 in the flip chip configuration may eliminate the spacer 156. Accordingly, the inverted window IC package 1104 may have a reduced package profile relative to the inverted window IC package 1100.

Referring now to FIG. 9C, an inverted window IC package 1106 includes an alternative spacer 1004. The alternative spacer 1004 may support the window IC 202 when the outline of the second IC 404 is such that the spacer 156 will not support the window IC 202. The alternative spacer 1004 may include two separate spacer portions to support the window IC 202. The alternative spacer 1004 may also include a ring around the second IC 404, or any other suitable spacer or spacers.

Referring now to FIG. 10A, an inverted window IC package 1200 includes the window IC 202, the window substrate 1202, the second IC 404, a third IC 1204 and the package substrate 102. The second IC 404 and the window substrate 1202 are coupled as shown in a flip chip configuration, with the second IC 404 located on top of the window substrate 1202. The window IC 202, the third IC 1204 and the package substrate 102 are arranged in a stacked configuration as shown. The third IC 1204 may include a SoC or other types of integrated circuit devices.

Referring now to FIG. 10B, an inverted window IC package 1300 is shown. In contrast to FIG. 10A, the inverted window IC package 1300 does not include the third IC 1204. The second IC 404 is similarly located on top of the window substrate 1202 in a flip chip configuration.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An integrated circuit package comprising:
a substrate including (i) a first surface having first bond pads, (ii) a second surface having second bond pads, and (iii) a single opening extending from the first surface to the second surface, wherein the opening is offset relative to a center of the substrate;
a first integrated circuit including a third surface having third bond pads, wherein the third surface of the first integrated circuit is attached to the second surface of the substrate, and wherein the third bond pads are accessible through the opening; and
a second integrated circuit including (i) a fourth surface having fourth bond pads and (ii) a fifth surface attached to the second surface of the substrate, wherein the second integrated circuit is adjacent to the first integrated circuit,
wherein at least one of the third bond pads on the third surface of the first integrated circuit is connected to at least one of the first bond pads on the first surface of the substrate using one or more bond wires extending through the opening, and
wherein at least one of the fourth bond pads on the fourth surface of the second integrated circuit is connected to at least one of the second bond pads on the second surface of the substrate using one or more bond wires.

2. The integrated circuit package of claim 1, wherein:
the opening includes (i) a first side and (ii) a second side;
the second integrated circuit is adjacent to the second side of the opening; and
the first bond pads on the first surface of the substrate are located adjacent to only the second side of the opening.

3. The integrated circuit package of claim 1, wherein at least one of the fourth bond pads on the fourth surface of the second integrated circuit is connected to at least one of the third bond pads on the third surface of the first integrated circuit through the substrate.

4. The integrated circuit package of claim 1, wherein at least one of the first bond pads on the first surface of the substrate is connected to at least one of the second bond pads on the second surface of the substrate through the substrate.

5. The integrated circuit package of claim 1, wherein a plurality of the second bond pads is located between the first integrated circuit and the second integrated circuit.

6. The integrated circuit package of claim 1, wherein the fifth surface of the second integrated circuit is attached to the second surface of the substrate using a flip chip connection.

7. The integrated circuit package of claim 1, wherein:
a perimeter of the opening is rectangular, and
the first bond pads are located adjacent to less than four sides of the perimeter.

8. An integrated circuit package comprising:
a first substrate including (i) a first surface having first bond pads, (ii) a second surface having second bond pads, and (iii) a single opening extending from the first surface to the second surface, wherein the single opening is located around a center portion of the first substrate;
a first integrated circuit including (i) a third surface having third bond pads and (ii) a fourth surface, wherein the third surface of the first integrated circuit is attached to the second surface of the first substrate, and wherein the third bond pads on the third surface of the first integrated circuit are accessible through the opening; and
a second integrated circuit having (i) a fifth surface and (ii) a sixth surface having fourth bond pads, wherein the fifth surface of the second integrated circuit is attached to the fourth surface of the first integrated circuit,
wherein at least one of the third bond pads on the third surface of the first integrated circuit is connected to at least one of the first bond pads on the first surface of the first substrate using one or more bond wires extending through the opening, and
wherein at least one of the fourth bond pads on the sixth surface of the second integrated circuit is connected to at least one of the second bond pads on the second surface of the first substrate using one or more bond wires.

9. The integrated circuit package of claim 8, wherein:
the opening includes (i) a first side and (ii) a second side; and
the first bond pads on the first surface of the first substrate are located adjacent to only the first side of the opening.

10. The integrated circuit package of claim 8, wherein at least one of the fourth bond pads on the sixth surface of the second integrated circuit is connected to at least one of the third bond pads on the third surface of the first integrated circuit through the first substrate.

11. The integrated circuit package of claim 8, wherein at least one of the first bond pads on the first surface of the first substrate is connected to at least one of the second bond pads on the second surface of the first substrate through the first substrate.

12. The integrated circuit package of claim 8, wherein:
the second integrated circuit has a smaller area than the first integrated circuit, and
the second integrated circuit is offset relative to a center of the opening.

13. The integrated circuit package of claim 12, further comprising:
a second substrate,
wherein the second substrate is attached to the fourth surface of the first integrated circuit, and
wherein the second substrate is adjacent to the second integrated circuit.

14. The integrated circuit package of claim 13, wherein:
the second substrate includes conductive traces, and
at least one of the fourth bond pads on the sixth surface of the second integrated circuit is connected to at least one of the second bond pads on the second surface of the first substrate via at least one of the conductive traces.

15. The integrated circuit package of claim 8, wherein:
the first integrated circuit includes a memory integrated circuit, and
the second integrated circuit includes a system-on-chip.

16. The integrated circuit package of claim 15, wherein the memory integrated circuit includes a dynamic random access memory integrated circuit.

17. The integrated circuit package of claim 8, wherein:
the opening has a rectangular perimeter; and
the first bond pads on the first surface of the first substrate are located adjacent to less than four sides of the rectangular perimeter.

* * * * *